US009646953B2

(12) United States Patent
Kong et al.

(10) Patent No.: US 9,646,953 B2
(45) Date of Patent: May 9, 2017

(54) INTEGRATED CIRCUIT PACKAGING TECHNIQUES AND CONFIGURATIONS FOR SMALL FORM-FACTOR OR WEARABLE DEVICES

(71) Applicant: INTEL CORPORATION, Santa Clara, CA (US)

(72) Inventors: Jackson Chung Peng Kong, Tanjung Tokong (MY); Bok Eng Cheah, Bayan Lepas (MY); Kooi Chi Ooi, Glugor (MY); Shanggar Periaman, Gelugor (MY); Michael P. Skinner, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 63 days.

(21) Appl. No.: 14/775,550

(22) PCT Filed: Nov. 12, 2014

(86) PCT No.: PCT/US2014/065313
§ 371 (c)(1),
(2) Date: Sep. 11, 2015

(87) PCT Pub. No.: WO2016/076865
PCT Pub. Date: May 19, 2016

(65) Prior Publication Data
US 2016/0343686 A1 Nov. 24, 2016

(51) Int. Cl.
*H01L 25/065* (2006.01)
*H01L 23/31* (2006.01)
(Continued)

(52) U.S. Cl.
CPC ............ *H01L 25/0655* (2013.01); *A44B 1/00* (2013.01); *A45C 1/06* (2013.01); *B43K 29/00* (2013.01);
(Continued)

(58) Field of Classification Search
CPC ........... H01L 23/0655; H01L 23/49827; H01L 23/49822; H01L 23/49838; H01L 23/3113;
(Continued)

(56) References Cited

U.S. PATENT DOCUMENTS 6,008,530 A * 12/1999 Kano .................. H01L 23/3107
257/685
6,605,869 B2 * 8/2003 Kimura ................. H01L 25/065
257/668

(Continued)

FOREIGN PATENT DOCUMENTS

EP 2760058 A1 7/2014
JP 2006140771 A 6/2006

OTHER PUBLICATIONS

Office Action mailed Sep. 13, 2016 for Korean Application No. 2015-7028072, 14 pages.
(Continued)

*Primary Examiner* — Alexander Oscar Williams
(74) *Attorney, Agent, or Firm* — Schwabe, Williamson & Wyatt, P.C.

(57) ABSTRACT

Embodiments of the present disclosure are directed toward integrated circuit (IC) packaging techniques and configurations for small form-factor or wearable devices. In one embodiment, an apparatus may include a substrate having a first side and a second side disposed opposite to the first side and a sidewall disposed between the first side and the second side, the sidewall defining a perimeter of the substrate, and
(Continued)

a plurality of through-substrate vias (TSVs) disposed between the first side and the second side of the substrate, and a first dielectric layer disposed on the first side and including electrical routing features to route electrical signals of one or more dies in a plane of the first dielectric layer. Other embodiments may be described and/or claimed.

22 Claims, 9 Drawing Sheets

(51) Int. Cl.

| | | |
|---|---|---|
| *H01L 23/367* | (2006.01) | |
| *H01L 21/48* | (2006.01) | |
| *A44B 1/00* | (2006.01) | |
| *G06F 1/16* | (2006.01) | |
| *H01L 25/00* | (2006.01) | |
| *H01L 23/48* | (2006.01) | |
| *A45C 1/06* | (2006.01) | |
| *B43K 29/00* | (2006.01) | |
| *G02C 11/00* | (2006.01) | |
| *H01L 21/56* | (2006.01) | |
| *H01L 23/498* | (2006.01) | |
| *H01L 23/00* | (2006.01) | |

(52) U.S. Cl.
CPC ............... *G02C 11/10* (2013.01); *G06F 1/163* (2013.01); *H01L 21/486* (2013.01); *H01L 21/4853* (2013.01); *H01L 21/4857* (2013.01); *H01L 21/4882* (2013.01); *H01L 21/565* (2013.01); *H01L 21/568* (2013.01); *H01L 23/3114* (2013.01); *H01L 23/3675* (2013.01); *H01L 23/48* (2013.01); *H01L 23/49822* (2013.01); *H01L 23/49827* (2013.01); *H01L 23/49838* (2013.01); *H01L 24/19* (2013.01); *H01L 25/50* (2013.01)

(58) Field of Classification Search
CPC ............... H01L 23/3675; H01L 21/486; H01L 21/4857; H01L 21/4853; H01L 21/565; H01L 21/4882; H01L 23/48; H01L 24/19; H01L 25/50; G06F 1/63; B43K 29/00; A45C 1/06; A44B 1/00
USPC ................ 257/777, 686, 685, 723, 773, 774
See application file for complete search history.

(56) References Cited

U.S. PATENT DOCUMENTS

| | | | |
|---|---|---|---|
| 7,508,061 B2 * | 3/2009 | Kang | ....................... G11C 5/04 257/668 |
| 7,646,082 B2 | 1/2010 | Chun et al. | |
| 8,431,441 B2 | 4/2013 | Chino | |
| 8,624,297 B2 | 1/2014 | Chun et al. | |
| 8,962,475 B2 | 2/2015 | Chun et al. | |
| 2007/0170228 A1 | 7/2007 | Zhao et al. | |
| 2009/0307646 A1 * | 12/2009 | Winter | .................... H01L 23/34 716/118 |
| 2010/0270669 A1 | 10/2010 | Medeiros, III | |
| 2013/0126215 A1 | 5/2013 | Cho et al. | |
| 2013/0161822 A1 | 6/2013 | Barbeau et al. | |
| 2014/0167251 A1 | 6/2014 | Iwata | |
| 2016/0379967 A1 * | 12/2016 | Gamini | ................... H01L 25/18 257/659 |

OTHER PUBLICATIONS

International Search Report and Written Opinion mailed Jul. 31, 2015, issued in corresponding International Application No. PCT/US2014/065313, 11 pages.

* cited by examiner

INTEGRATED CIRCUIT PACKAGING TECHNIQUES AND CONFIGURATIONS FOR SMALL FORM-FACTOR OR WEARABLE DEVICES

CROSS-REFERENCE TO RELATED APPLICATION

The present application is a national phase entry under 35 U.S.C. §371 of International Application No. PCT/US2014/065313, filed Nov. 12, 2014, entitled "INTEGRATED CIRCUIT PACKAGING TECHNIQUES AND CONFIGURATIONS FOR SMALL FORM-FACTOR OR WEARABALE DEVICES", which designates the United States of America, the entire disclosure of which is hereby incorporated by reference in its entirety and all purposes.

FIELD

Embodiments of the present disclosure generally relate to the field of integrated circuits, and more particularly, to integrated circuit (IC) packaging techniques and configurations for small form-factor wearable devices.

BACKGROUND

Wearable and small form-factor devices with integrated circuit (IC) components such as, for example, dies and sensors are emerging. However, heat removal away from such IC components in wearable or small form-factor devices remains a challenge. Further, traditional packaging may be too large to allow such IC components to be integrated and electrically coupled together in the small form-factor devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
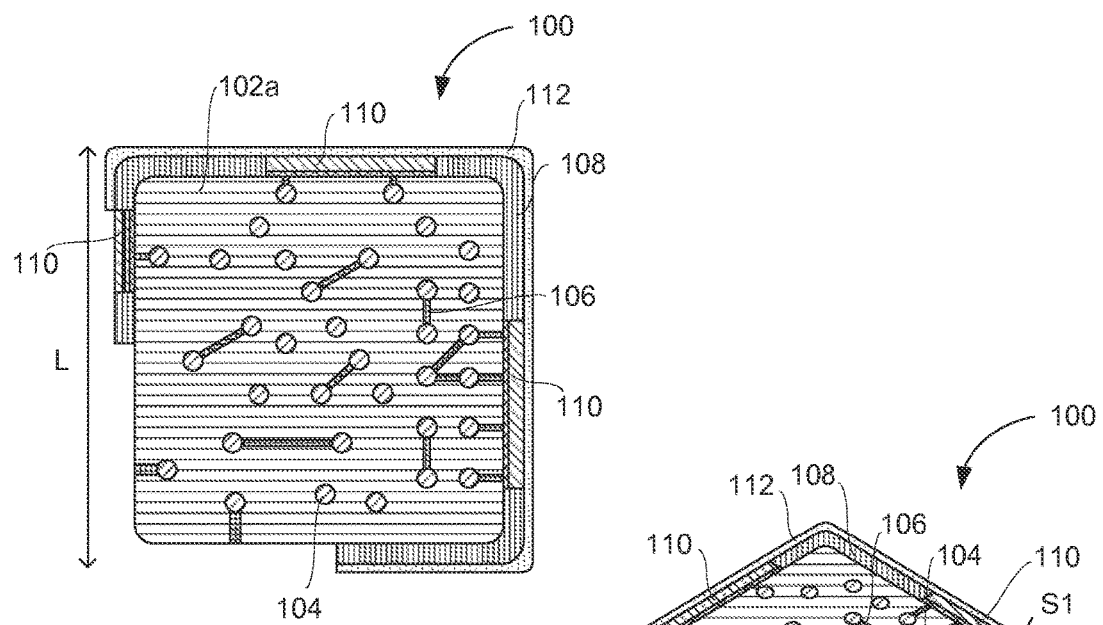
FIGS. 1A-C schematically illustrate views of an example integrated circuit (IC) package assembly, in accordance with some embodiments.

Embodiments of the present disclosure describe integrated circuit (IC) packaging techniques and configurations for small form-factor or wearable devices. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C). The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature. As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1B:
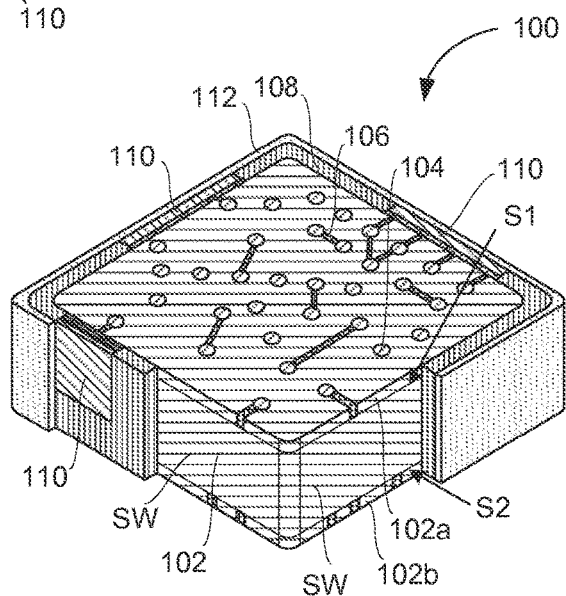
Figure 1C:
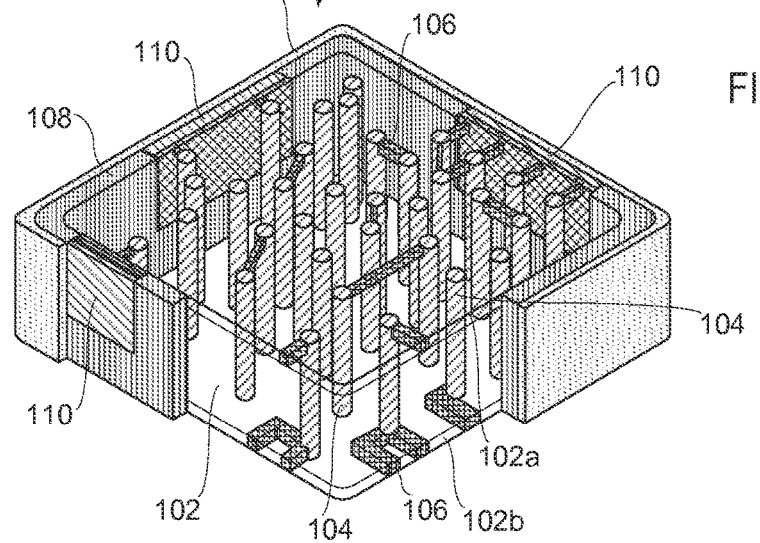

FIGS. 1A-C schematically illustrate views of an example integrated circuit (IC) package assembly 100, in accordance with some embodiments. FIG. 1A schematically illustrates a top view of the IC package assembly 100. FIG. 1B schematically illustrates a perspective view of the IC package assembly 100. FIG. 1C schematically illustrates a partially transparent perspective view of the IC package assembly 100. The substrate 102 and dielectric layers 102*a*, 102*b* are transparently depicted in FIG. 1C.

According to various embodiments, the IC package assembly 100 of FIGS. 1A-C may include a substrate 102. In some embodiments, the substrate 102 may be composed of a semiconductor material or glass. For example, the substrate 102 may be a silicon bridge/interposer in some embodiments. The substrate 102 may be composed of other suitable materials that are compatible with complementary metal-oxide-semiconductor (CMOS) fabrication techniques to form circuitry on the substrate 102 in other embodiments.

The substrate 102 may have a first side S1 and a second side S2 disposed opposite to the first side S1, as can be seen. In some embodiments, one or more through-substrate vias (hereinafter "TSVs 104") such as, for example, through-silicon vias may be formed through the substrate 102 between the first side S1 and the second side S2. The TSVs 104 may include conduits filled with an electrically conductive material such as, for example, copper and may be formed according to any suitable process.

In some embodiments, one or more of the TSVs 104 may be configured to route electrical signals of one or more dies (e.g., hereinafter "dies 110") that are coupled with the substrate 102 or may be configured to route electrical signals between two or more of the dies 110. For example, the TSVs 104 may be configured to route input/output (I/O) and/or power/ground signals in some embodiments. In some embodiments, one or more of the TSVs 104 may be thermal TSVs that are configured to route heat away from the substrate 102. For example, the thermal TSVs may conduct heat in a direction that is parallel with a lengthwise dimension of the thermal TSVs. The thermal TSVs may not be configured to route electrical signals in some embodiments. In some embodiments, a combination of thermal TSVs and signal TSVs may be implemented in the substrate 102.

In some embodiments, a first dielectric layer 102*a* may be formed on the first side S1 and a second dielectric layer 102*b* may be formed on the second side S2 of the substrate 102. Each of the first dielectric layer 102*a* and the second dielectric layer 102*b* may include electrical routing features 106 formed therein to route electrical signals (e.g., of the dies 110). In some embodiments, the electrical routing features 106 may be configured to route electrical signals in a plane of the first dielectric layer 102*a* or second dielectric layer 102*b* (e.g., horizontally). In some embodiments, the dielectric layers 102*a*, 102*b* may serve as passivation layers.

The electrical routing features 106 may include, for example, redistribution lines such as traces in some embodiments. In other embodiments, the electrical routing features 106 may include trenches and/or vias. For example, in some embodiments, one or both of dielectric layers 102*a*, 102*b* may represent multiple dielectric layers stacked together. In such embodiments, the electrical routing features 106 may include trenches configured to route electrical signals horizontally in a plane of the first dielectric layer 102*a* or the second dielectric layer 102*b* and vias to route electrical signals vertically between the stacked dielectric layers.

In some embodiments, the electrical routing features 106 couple two or more TSVs of the TSVs 104, as can be seen in the example depicted in the FIGS. 1A-C. In some embodiments, the electrical routing features 106 may couple one or more TSVs of the TSVs 104 with a die of the dies 110 at a terminating, peripheral edge of the dielectric layers 102*a*, 102*b*, as can be seen in the example depicted in the FIGS. 1A-C. The electrical routing features 106 may be composed of an electrically conductive material such as, for example, copper. The electrical routing features 106 may be composed of other suitable materials in other embodiments.

In some embodiments, the dielectric layers 102*a*, 102*b* may be composed of silicon oxide (SiO2) or silicon nitride (SiN). The dielectric layers 102*a*, 102*b* may be composed of other suitable dielectric materials in other embodiments. The dielectric layers 102*a*, 102*b* may be formed using suitable techniques to form backend layers on a die such as, for example, CMOS fabrication techniques. The substrate 102 may include a sidewall SW disposed between the first side S1 and the second side S2 of the substrate 102, as can be seen. The sidewall SW may be substantially perpendicular with the first side S1 and the second side S2 in some embodiments. The sidewall may define a perimeter (e.g., a terminating edge) of the substrate 102. In some embodiments, prior to attaching the dies 110, the sidewall SW may be configured to receive attachment of the dies 110 on respective surfaces of the sidewall SW. For example, the respective surfaces may be sized to receive the dies 110.

According to various embodiments, the dies 110 may be coupled with respective surfaces of the sidewall SW. For example, the dies 110 may include die-level interconnects (sometimes referred to as first-level interconnects (FLIs)) such as, for example, bumps, pillars or other analogous features that electrically couple the dies 110 with the electrical routing features 106 and/or the TSVs 104. In some embodiments, an active side of the dies 110 may be coupled with the sidewall SW. In some embodiments, the dies 110 may be substantially flush with one or both of the dielectric layers 102*a*, 102*b*, as can be seen, or the dies 110 may otherwise overlap at least a portion of the dielectric layer 102*a*, 102*b* to facilitate electrical coupling between the dies 110 and the electrical routing features 106. In some embodiments, the dies 110 may be embedded stacked dies (e.g., as depicted on the left sidewall of FIG. 1A). In some embodiments, the dies 110 may be, include, or be a part of a processor, memory, SoC or ASIC.

In some embodiments, the sidewall SW may have three or more sides. In the depicted example, the sidewall SW has four sides in a square profile with dies 110 coupled to different sides. However, in other embodiments, the sidewall SW may have three sides in a triangle profile or five or more sides in a polygon profile. The profile shape may be symmetric or asymmetric. For example, in some embodiments, the sidewall SW may have four sides in a rectangular shape with at least two sides of different length. The sides may be configured to have a profile shape that allows implementation of the IC package assembly 100 into a desired wearable device or small form-factor product. Some of the sides may have one or more of the dies 110 attached while others may not.

In some embodiments, the dies 110 may be encapsulated, at least in part, by an encapsulant 108. The encapsulant 108 may protect the dies 110 from harmful environmental factors such as, for example, moisture or oxidation and/or may promote adhesion to the sidewall SW in some embodiments. In some embodiments, the encapsulant 108 may be a flexible encapsulant that can be wrapped around the substrate 102 prior to a thermal process that cures/bonds the encapsulant 108. In some embodiments, the encapsulant 108 may be substantially flush with an inactive side of the dies 110 to allow a heat spreader film 112 to make thermal contact with the inactive side of the dies 110. In other embodiments, the encapsulant 108 may fully encapsulate the dies 110.

In some embodiments, the encapsulant 108 may be composed of polysiloxane, epoxy resin, acrylate (e.g., polymethyl methacrylate), polyurethane, benzocyclobutene (BCB), polyimide, polyamide, high-density polyethylene (HDPE), bismaleimide-triazine (BT) resin, liquid crystal polymer (LCP), aramide, polydimethylsiloxane (PDMS), or suitable combinations thereof. The encapsulant 108 may be composed of other suitable materials in other embodiments.

In some embodiments, a heat spreader film 112 may be disposed on the encapsulant 108 and may be coupled with an inactive side of the dies 110, as can be seen. The heat spreader film 112 may be composed of a thermally conductive material such as metal (e.g., copper). In some embodiments, the heat spreader film 112 may provide an outer surface of the IC package assembly 100.

According to various embodiments, a device layer (not shown) may be formed on the substrate 102. For example, the device layer may include one or more active devices such as transistors formed using conventional semiconductor fabrication techniques such as CMOS fabrication techniques. The device layer may be disposed, for example, between the substrate 102 and the first dielectric layer 102a or between the substrate 102 and the second dielectric layer 102b, in some embodiments. The substrate 102 may be a substrate of an active die in some embodiments. The active devices of the device layer may be electrically coupled with the electrical routing features 106 of one or both of the dielectric layer(s) 102a, 102b, one or more of the TSVs 104 or with one or more of the dies 110, according to some embodiments.

In some embodiments, a length L of the IC package assembly 100 may be less than or equal to 1 centimeter (cm). In some embodiments, the length L may be less than 0.5 millimeter (mm). The IC package assembly 100 may have other suitable dimensions in other embodiments.

Figure 2A:
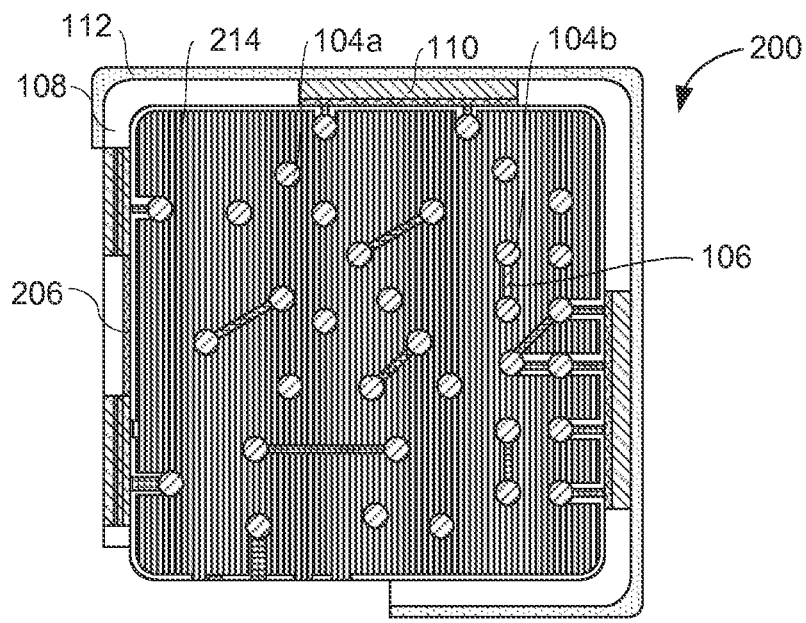
FIGS. 2A-B schematically illustrate views of an example integrated circuit (IC) package assembly including a power or ground plane, in accordance with some embodiments.
Figure 2B:
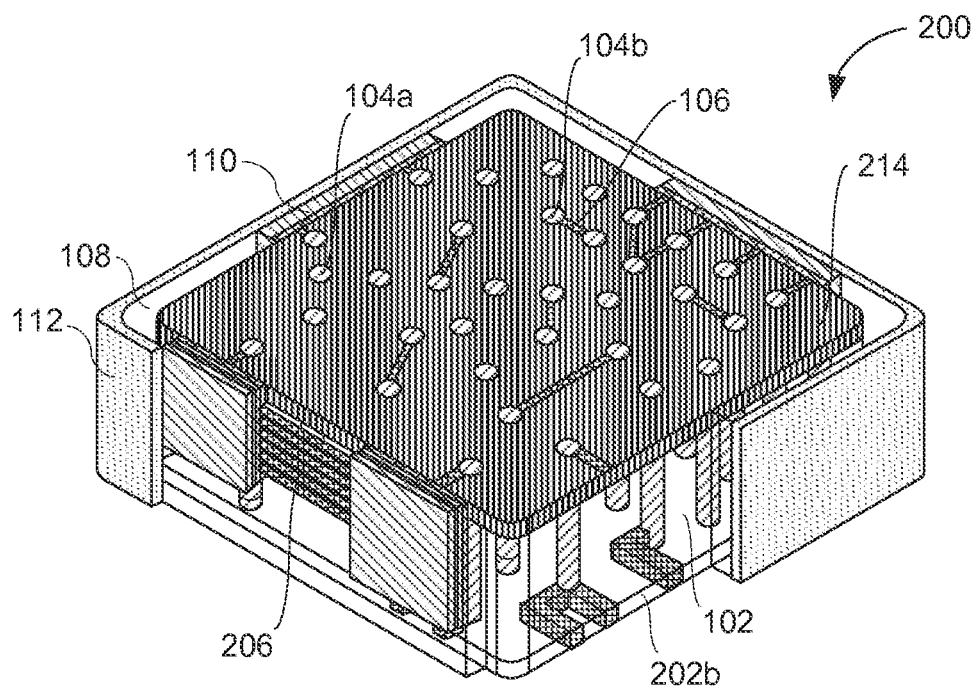

The IC package assembly 100 may provide a modular, small form-factor assembly that can easily integrate functional devices (e.g., dies 110) per customer needs and requirements. In some embodiments, the IC package assembly 100 may include vertical interconnects (e.g., TSVs 104) for improved power management and I/O communication between each functional device. The IC package assembly 100 may further provide an effective thermal solution by way of thermal TSVs of the TSVs 104 and/or the heat spreader film 112. FIGS. 2A-B schematically illustrate views of an example integrated circuit (IC) package assembly 200 including a power or ground plane, in accordance with some embodiments. The IC package assembly 200 may comport with embodiments described in connection with the IC package assembly 100 of FIGS. 1A-C. FIG. 2A schematically illustrates a top view of the IC package assembly 200. FIG. 2B schematically illustrates a perspective view of the IC package assembly 200. A portion of the heat spreader film 112 and encapsulant 108 are cut away and the substrate 102 is transparent in FIGS. 2A-B to avoid obscuring underlying features In some embodiments, the IC package assembly 200 may include a power or ground plane 214. The power or ground plane 214 may be disposed on the substrate 102. For example, in some embodiments, the power or ground plane 214 may be coupled with or disposed on the first dielectric layer 102a of FIGS. 1A-C.

The power or ground plane 214 may be configured to route ground (e.g., Vss) or power signal for operation of the dies 110. The power or ground plane 214 may increase noise shielding and decrease electromagnetic interference (EMI) or high-speed signal crosstalk coupling. The power or ground plane 214 may be composed of an electrically conductive material that is electrically coupled with power/ground TSVs 104a. The power/ground TSVs 104a may be in direct physical and electrical contact with the power or ground plane 214. Although not shown, the power or ground plane 214 may be electrically insulated from signal TSVs 104b and from electrical routing features 106 that couple the signal TSVs 104b together or with dies 110, as can be seen. For example, a dielectric material such as silicon oxide may be disposed between the signal features (e.g., signal TSVs 104b and corresponding electrical routing features 106) and the power or ground plane 214.

The IC package assembly 200 may include a layer 202b on the substrate 102, as can be seen. According to various embodiments, the layer 202b may represent the second dielectric layer 102b of FIGS. 1A-C. In other embodiments, the layer 202b may represent a device layer (e.g., having active devices such as transistors) formed on the substrate 102.

In some embodiments, the IC package assembly 200 may include electrical routing features 206 disposed on the sidewall SW to route electrical signals between the dies 110. The electrical routing features 206 are further described in connection with FIGS. 3A-C.

Figure 3A:
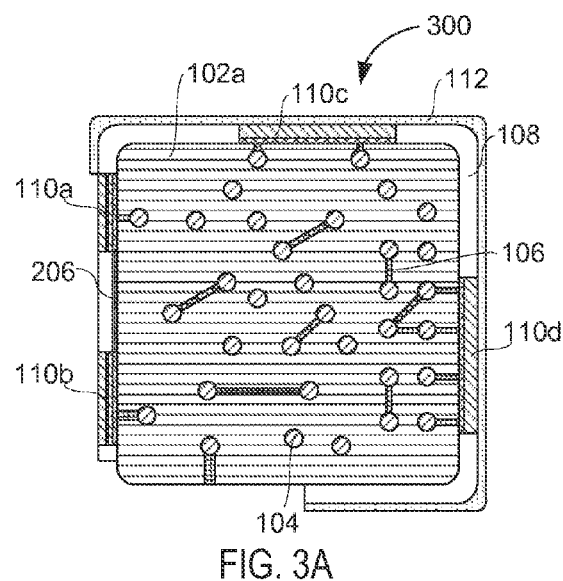
FIGS. 3A-C schematically illustrate views of an example integrated circuit (IC) package assembly including electrical routing features on the sidewall, in accordance with some embodiments.
Figure 3B:
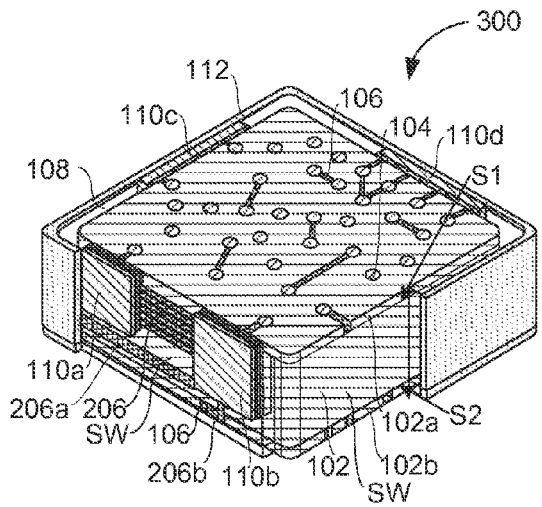
Figure 3C:
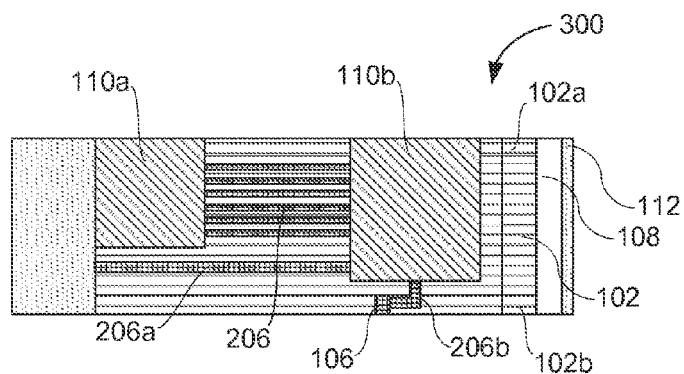

FIGS. 3A-C schematically illustrate views of an example integrated circuit (IC) package assembly 300 including electrical routing features 206, 206a, 206b on the sidewall SW, in accordance with some embodiments. FIG. 3A schematically illustrates a top view of the IC package assembly 300. FIG. 3B schematically illustrates a perspective view of the IC package assembly 300. FIG. 3C schematically illustrates a side view of the IC package assembly 300. A portion of the heat spreader film 112 and encapsulant 108 are cut away in FIGS. 3A-C to avoid obscuring underlying features. The encapsulant 108 is transparently depicted in FIGS. 3B-C to avoid obscuring underlying features.

The IC package assembly 300 includes plurality of dies 110a, 110b, 110c, 110d coupled with the sidewall SW of the substrate 102, as can be seen. The dies 110a, 110b, 110c, 110d may comport with embodiments described in connection with dies 110 of FIGS. 1A-C and 2A-B.

Figure 4A:
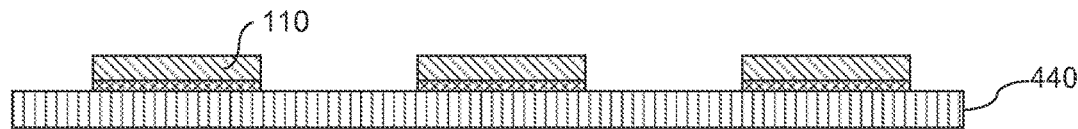
FIGS. 4A-K schematically illustrate views of an example integrated circuit (IC) package assembly during various stages of fabrication, in accordance with some embodiments.
Figure 4B:
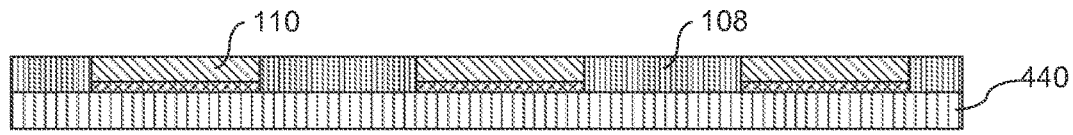
Figure 4C:

According to various embodiments, electrical routing features 206 may be formed on the sidewall SW to route electrical signals between two or more of the dies (e.g., between dies 110a and 110b in the depicted example in FIGS. 3A-C). The electrical routing features 206 may route electrical signals between dies 110a and 110b that are disposed on a same side of the sidewall SW, as can be seen. In some embodiments, electrical routing features 206a may be formed to route electrical signals between dies that are disposed on different sides of the sidewall (e.g., between dies 110b and 110c in the depicted example in FIGS. 3B-C). The electrical routing features 206a may wrap around corners or other edges between sides of the sidewall SW. In some embodiments, electrical routing features 206b may be formed to route electrical signals between one or more of the dies 110a, 110b, 110c, 110d and electrical routing features 106 of the first dielectric layer 102a or the second dielectric layer 102b (e.g., between die 110b and electrical routing features 106 of the second dielectric layer 102b in the depicted example in FIG. 3C). The electrical routing feature 106 at the edge of the dielectric layers 102a, 102b may be referred to as an "edge pad." FIGS. 4A-K schematically illustrate views of an example integrated circuit (IC) package assembly (e.g., IC package assembly 100, 200, or 300 described herein) during various stages of fabrication, in accordance with some embodiments. Referring to FIG. 4A, an IC package assembly is depicted subsequent to coupling a plurality of dies 110 with a carrier 440. In some embodiments, the carrier 440 may have a metal surface upon which the dies 110 are placed. An active side of the dies may be face down on the carrier 440. Referring to FIG. 4B, the IC package assembly is depicted subsequent to depositing an encapsulant 108 to at least partially encapsulate the dies. In some embodiments, the encapsulant 108 may be deposited using a thin-film lamination process. The encapsulant 108 may be composed of a flexible material that can wrap around the substrate during a subsequent operation. Referring to FIG. 4C, the IC package assembly is depicted subsequent to removing the encapsulant 108 and the dies 110 from the carrier 440. The carrier 440 may be detached using any suitable technique including, for example, etch or thermal processes. The active side of the dies 110 is depicted as facing up in FIG. 4C.

Figure 4D:
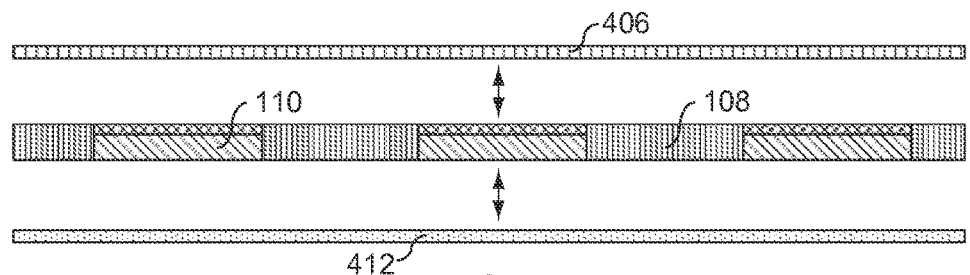

Referring to FIG. 4D, the IC package assembly is depicted to show coupling of a metal sheet 406 on an active side of the dies and encapsulant 108 to provide material for formation of electrical routing features (e.g., electrical routing features 206, 206a, 206b of FIG. 3C) and another metal sheet 412 on an inactive side of the dies to provide a heat spreader film 112. According to various embodiments, coupling of the metal sheet 406 and/or metal sheet 412 may be performed using a metal foil lamination and bonding (e.g., thermal/pressure) process.

Figure 4E:
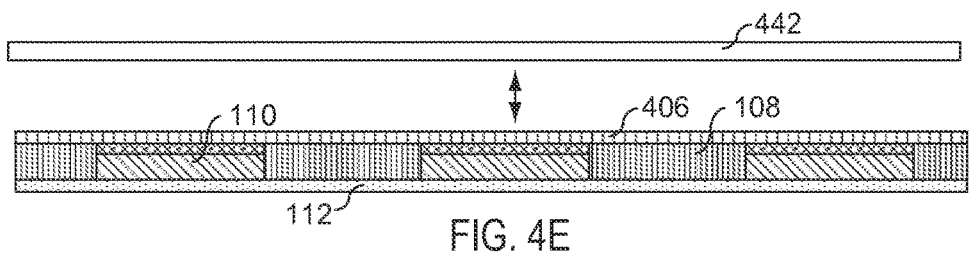

Referring to FIG. 4E, the IC package assembly is depicted to show deposition of a photosensitive material 442 on the metal sheet 406. For example, the photosensitive material 442 may include Dry Film Resist (DFR) or another suitable masking material for patterning. The photosensitive material 442 may be deposited using any suitable process including, for example, DFR lamination, a spin-on process and the like.

Figure 4F:
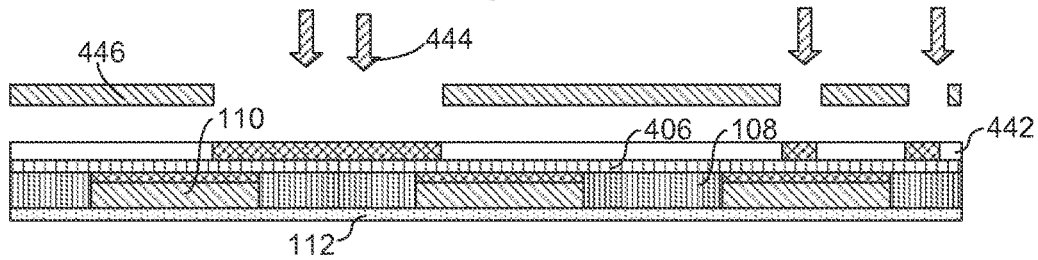

Referring to FIG. 4F, the IC package assembly is depicted to show a patterned exposure of the photosensitive material 442 by light 444 through openings in a mask 446 to facilitate removal of exposed portions of the photosensitive material 442. The patterned photosensitive material 442 may define areas where electrical routing features (e.g., electrical routing features 206, 206a, 206b of FIG. 3C) and die pad 210 are to be formed in the metal sheet 406. In some embodiments, the photosensitive material 442 may be patterned using a photolithography and develop process. The die pad 210 may facilitate electrical connection between the device active layers on dies 110 and electrical routing structures 106 on substrate 102.

Figure 4G:
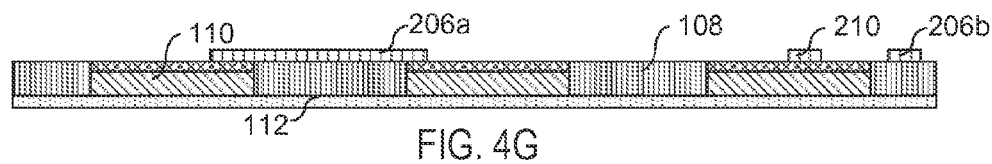
Figure 4H:
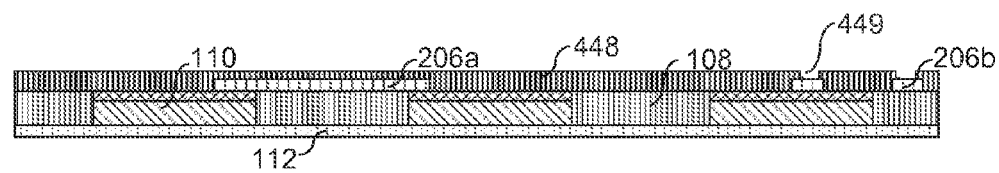

Referring to FIG. 4G, the IC package assembly is depicted subsequent to performing an etch process to remove portions of the metal sheet 406 to form electrical routing features 206a, 206b (e.g., electrical routing features 206, 206a, 206b of FIG. 3C) and die pad 210 on the dies 110 and/or encapsulant 108. Referring to FIG. 4H, the IC package assembly is depicted subsequent to depositing a solder mask layer 448 and forming openings 449 to allow coupling of the electrical routing features 206b and die pad 210 with corresponding electrical routing features 106 (e.g., pads or other suitable contacts) on a substrate 102. The solder mask layer 448 may be formed by a lamination process. The openings 449 may be formed using a patterning process and/or development process. In some embodiments, the solder mask layer 448 may insulate and protect the electrical routing features 206a, 206b (e.g., electrical routing features 206, 206a, 206b of FIG. 3C) and die pad 210.

Figure 4I:
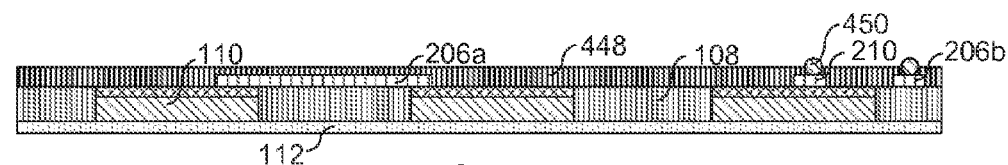

Referring to FIG. 4I, the IC package assembly is depicted subsequent to performing a solder paste printing or microbump placement process to form solder bumps 450 that are to form an electrical connection between the electrical routing features 206b or die pad 210 and corresponding electrical routing features 106 on the substrate 102. Other suitable die-interconnect structures than solder bumps 450 may be used to couple the electrical routing features 206b or die pad 210 and electrical routing features 106 in other embodiments.

Figure 4J:
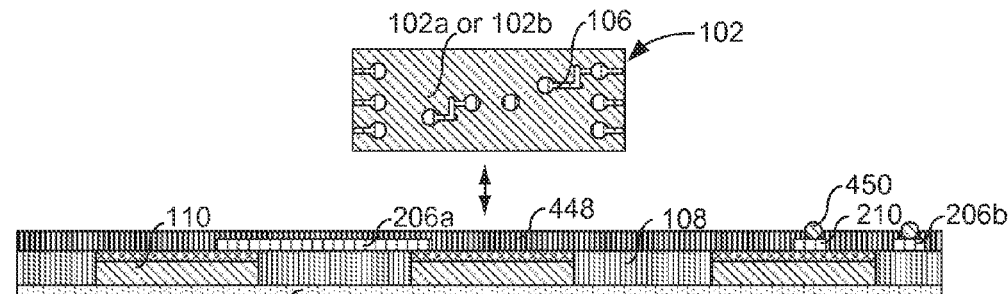
Figure 4K:
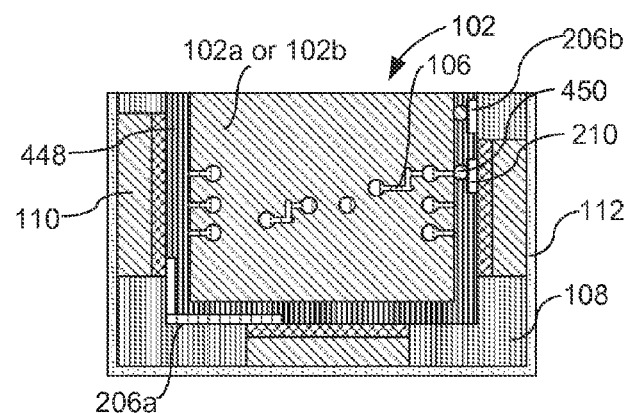

Referring to FIG. 4J, the IC package assembly is depicted subsequent to providing a substrate 102 having a first dielectric layer 102a and/or second dielectric layer 102b with electrical routing features 106 formed therein. Referring to FIG. 4K, the IC package assembly is depicted subsequent to attaching the assembly including the dies 110 with the substrate 102. For example, the die pad 210 and/or electrical routing features 206a, 206b may be aligned with electrical routing features 106 on the substrate 102 and the encapsulant 108 and dies 110 may be wrapped or rolled around the substrate 102 using a thin-film rolling/wrapping process. A bonding and/or curing process may be applied to form solder joints between the electrical routing features 206b or die pad 210 and electrical routing features 106 and/or to cure the encapsulant 108 or solder mask layer 448. In some embodiments, curing the encapsulant 108 may cause the encapsulant to become rigid in the wrapped shape.

In other embodiments, the dies 110 may wrap around more or fewer sides of the substrate than depicted. For example, in some embodiments, the encapsulant 108 with the dies 110 may wrap around an entire perimeter of the substrate 102. In some embodiments, formation of electrical routing features 206a, 206b using metal sheet 406 and/or formation of solder mask layer 448 may be omitted completely from the method of fabrication described in connection with FIGS. 4A-K. Other suitable techniques to fabricate the IC package assembly may be used in other embodiments.

Figure 5:
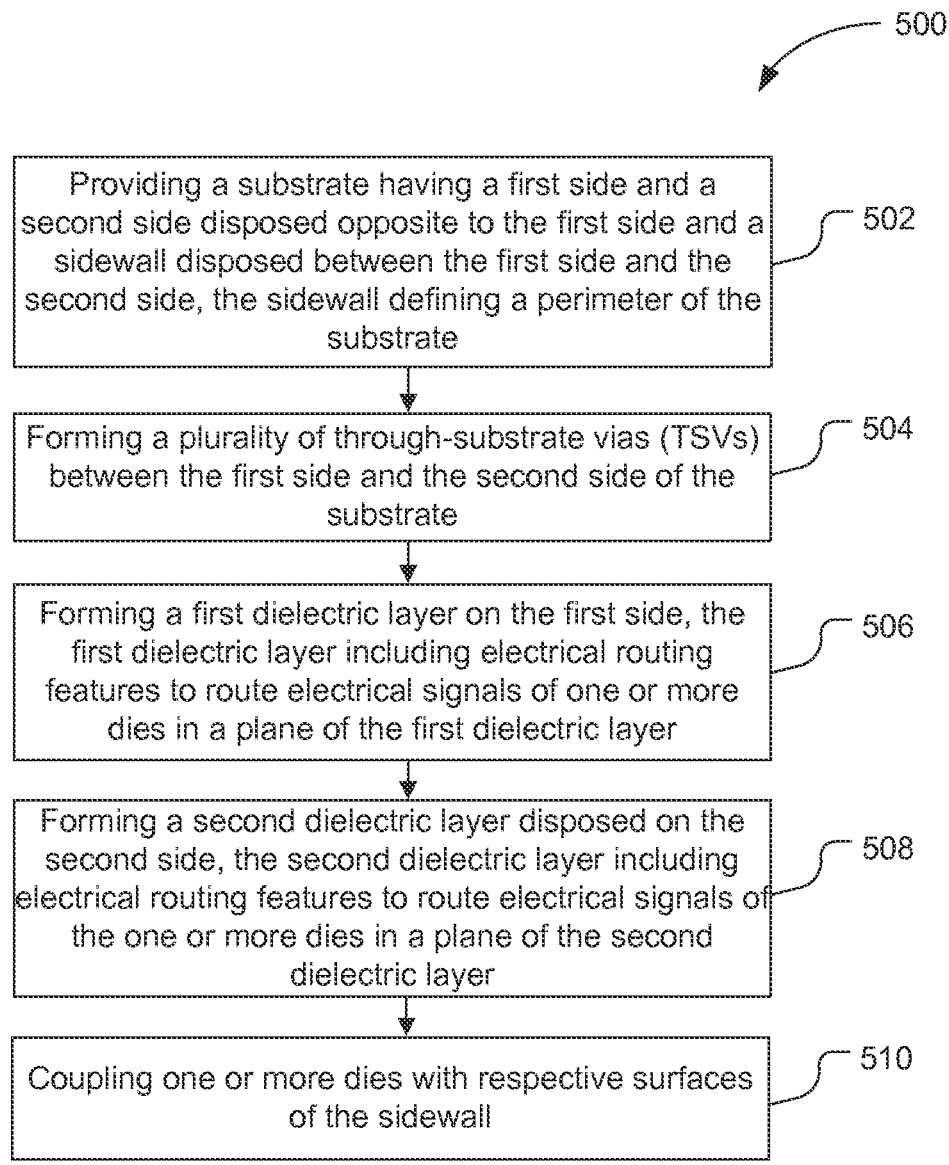
FIG. 5 schematically illustrates a flow diagram for a method of fabricating an IC package assembly, in accordance with some embodiments.

FIG. 5 schematically illustrates a flow diagram for a method 500 of fabricating an IC package assembly (e.g., IC package assembly described in connection with FIGS. 1-4), in accordance with some embodiments. The method 500 may comport with embodiments described in connection with FIGS. 1-4 and vice versa.

At 502, the method 500 may include providing a substrate (e.g., substrate 102 of FIG. 1B or 4J) having a first side (e.g., first side S1 of FIG. 1B) and a second side (e.g., second side S2 of FIG. 1B) disposed opposite to the first side and a sidewall (e.g., sidewall SW of FIG. 1B) disposed between the first side and the second side, the sidewall defining a perimeter of the substrate. The sidewall may be configured to receive attachment of one or more dies on respective surfaces of the sidewall.

At 504, the method 500 may include forming a plurality of through-substrate vias (e.g., TSVs 104 of FIG. 1B) between the first side and the second side of the substrate. The TSVs may be formed using any suitable technique including, for example, mechanical or laser drilling to form conduits through the substrate and metal deposition processes to fill the conduits with metal.

At 506, the method 500 may include forming a first dielectric layer (e.g., first dielectric layer 102a of FIG. 1B) on the first side, the first dielectric layer including electrical routing features (e.g., electrical routing features 106 of FIG. 1B) to route electrical signals of one or more dies in a plane of the first dielectric layer. The first dielectric layer may be formed according to a wide variety of suitable techniques including, for example, forming an oxide on the substrate, patterning the oxide and depositing metal to fill openings in the patterned oxide. Such technique may be performed to provide a stack of dielectric layers with horizontal and/or vertical electrical routing features.

At 508, the method 500 may include forming a second dielectric layer (e.g., second dielectric layer 102b of FIG. 1B) disposed on the second side, the second dielectric layer including electrical routing features to route electrical signals of the one or more dies in a plane of the second dielectric layer. The second dielectric layer may be formed according to similar techniques used to fabricate the first dielectric layer.

At 510, the method 500 may include coupling one or more dies (e.g., dies 110 of FIG. 1B or FIGS. 4J-K) with respective surfaces of the sidewall. The dies may be attached using any suitable technique to form electrical connections between the dies and the electrical routing features of the substrate. For example, the electrical routing features may include edge pads that are configured to receive corresponding die interconnects (e.g., bumps or pillars) disposed on the dies. A solder reflow process may be performed to form solder joints between the dies and the electrical routing features in some embodiments. Other suitable techniques to couple the dies with the substrate may be used in other embodiments.

Figure 6:
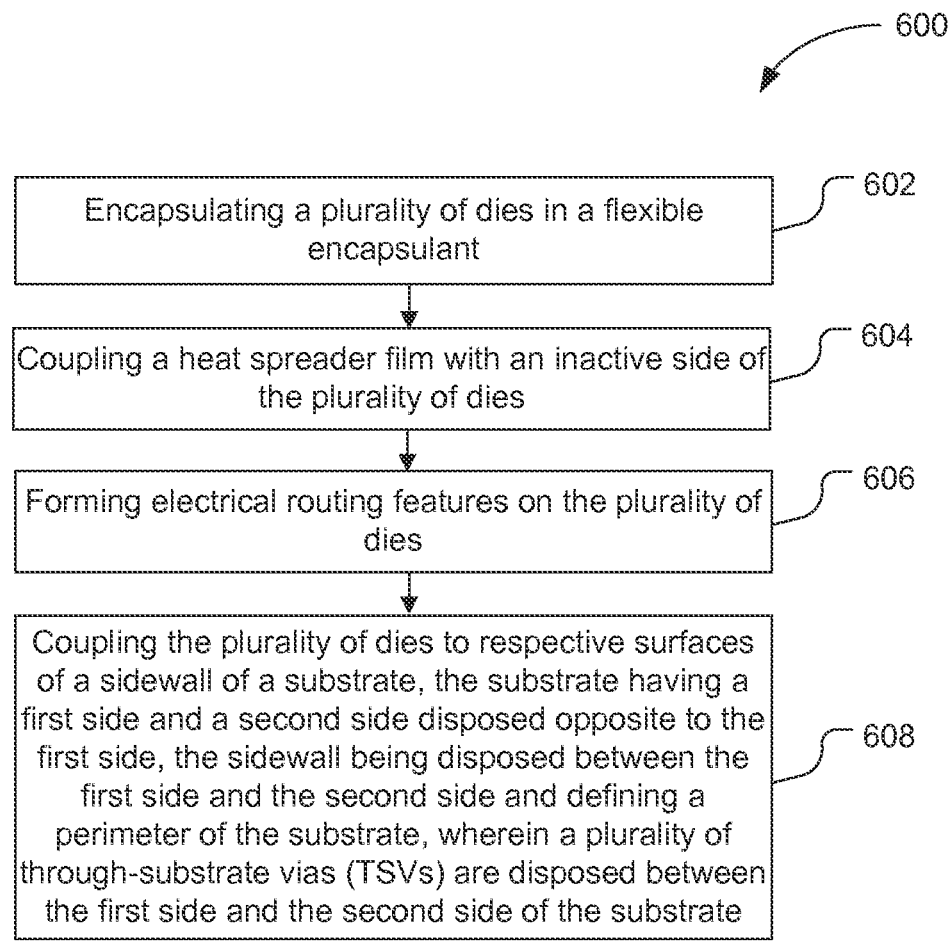
FIG. 6 schematically illustrates a flow diagram for another method of fabricating an IC package assembly, in accordance with some embodiments.

FIG. 6 schematically illustrates a flow diagram for another method 600 of fabricating an IC package assembly (e.g., IC package assembly described in connection with FIGS. 1-4), in accordance with some embodiments. The method 600 may comport with embodiments described in connection with FIGS. 1-5 and vice versa.

At 602, the method 600 may include encapsulating a plurality of dies (e.g., dies 110 of FIGS. 4A-C) in a flexible encapsulant. The dies may be encapsulated, for example, according to techniques described in connection with FIGS. 4A-C. An active side of the plurality of dies may be coupled to a carrier (e.g., carrier 440 of FIGS. 4A-B). A flexible encapsulant may be deposited on the plurality of dies and the dies may be decoupled from the carrier.

At 604, the method 600 may include coupling a heat spreader film (e.g., heat spreader film 112 of FIG. 4E) with an inactive side of the plurality of dies. The heat spreader film may be coupled with the dies, for example, according to techniques described in connection with FIGS. 4D-E. In some embodiments, the heat spreader film may be coupled with an inactive side of the plurality of dies prior to coupling the plurality of dies to respective surfaces of the sidewall at 608.

At 606, the method 600 may include forming electrical routing features (e.g., electrical routing features 206, 206a, 206b of FIG. 3C or electrical routing features 206a, 206b of FIG. 4G) on the plurality of dies. The electrical routing features may be formed, for example, according to techniques described in connection with FIGS. 4D-4I. A metal foil may be deposited on an active side of the plurality of dies. The metal foil may be patterned to form pads or traces. A solder mask layer (e.g., solder mask layer 448 of FIG. 4H) may be deposited on the pads or traces.

At 608, the method 600 may include coupling the plurality of dies to respective surfaces of a sidewall of a substrate (e.g., substrate 102 of FIGS. 4J-K), the substrate having a first side and a second side disposed opposite to the first side, the sidewall being disposed between the first side and the second side and defining a perimeter of the substrate, wherein a plurality of through-substrate vias (TSVs) are disposed between the first side and the second side of the substrate. In some embodiments, the plurality of dies may be coupled to the sidewall, for example, according to techniques described in connection with FIGS. 4J-K. The flexible encapsulant with the plurality of dies may be wrapped around the sidewall of the substrate. A thermal process may be applied to cure the flexible encapsulant. In some embodiments, the thermal process may be a solder reflow process that forms solder joints between the dies and electrical routing features on the substrate.

Various operations are described as multiple discrete operations in turn, in a manner that is most helpful in understanding the claimed subject matter. However, the order of description should not be construed as to imply that these operations are necessarily order dependent.

Figure 7:
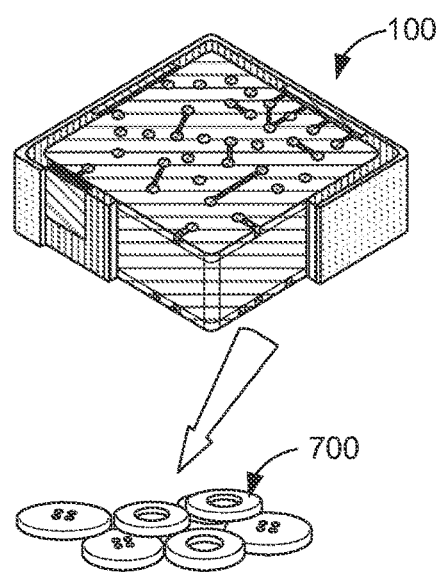
FIGS. 7-8 schematically illustrate example articles of manufacture that may incorporate an integrated circuit (IC) package assembly as described herein, in accordance with some embodiments.
Figure 8:
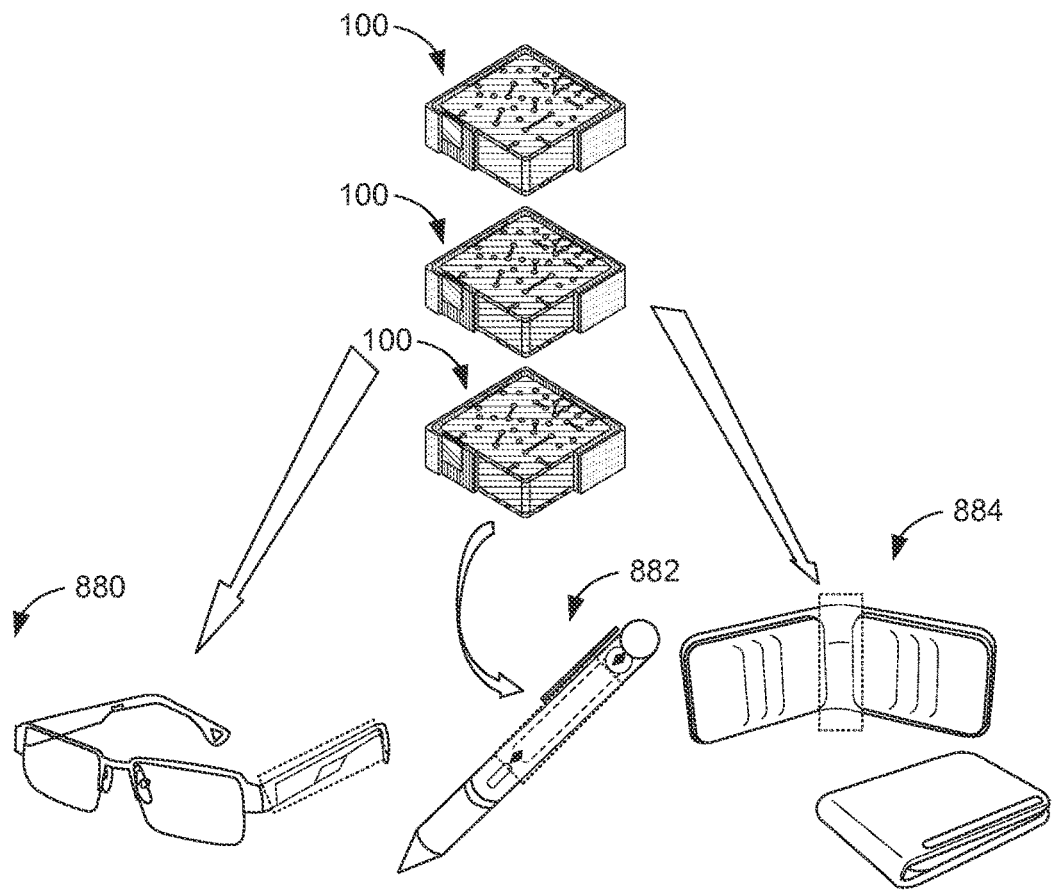

FIGS. 7-8 schematically illustrate example articles of manufacture that may incorporate an integrated circuit (IC) package assembly (e.g., IC package assembly 100, 200 or 300) as described herein, in accordance with some embodiments. The articles of manufacture may include a wide variety of suitable small form-factor and/or wearable devices. For example, in some embodiments, the IC package assembly 100 may be part of one or more buttons 700. In some embodiments, the IC package assembly may be incorporated into a spectacle frame 880, a smart-pen 882 or wallet 884, as depicted.

Figure 9:
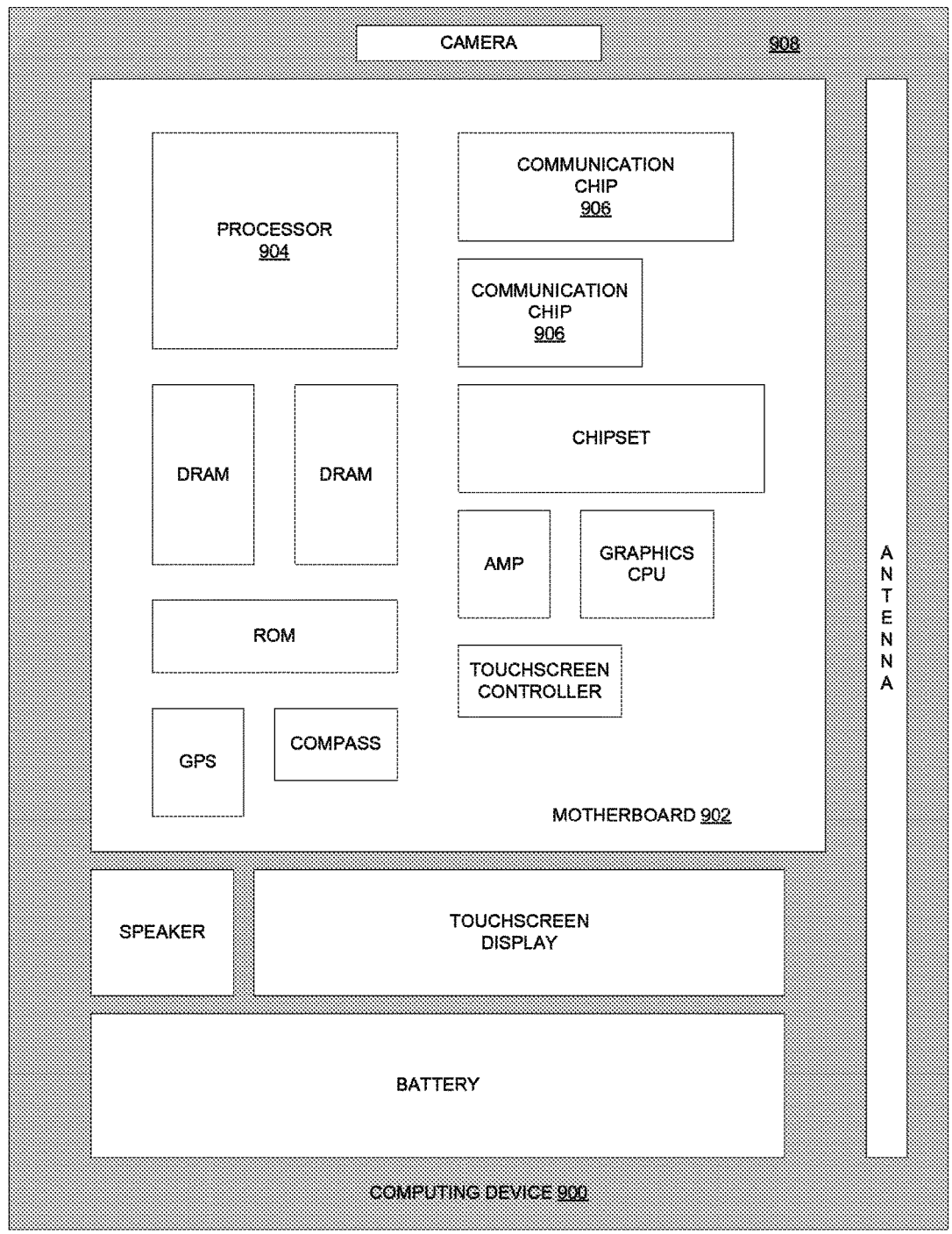
FIG. 9 schematically illustrates a computing device that includes an IC package assembly as described herein, in accordance with some embodiments.

In some embodiments, multiple IC package assemblies 100 may be stacked together such that electrical routing features of adjacent IC package assemblies are coupled together using any suitable technique (e.g., die-interconnect structures for flip-chip mounted dies). The stacked IC package assemblies 100 may be incorporated into any of a wide variety of articles including, for example, those depicted in FIGS. 7-8. For example, in some embodiments, one or more of the IC package assemblies 100 may be disposed in a dashed region indicated in each of the spectacle frame 880, smart-pen 882 or wallet 884. Embodiments of the present disclosure may be implemented into a system using any suitable hardware and/or software to configure as desired. FIG. 9 schematically illustrates a computing device 900 that includes an IC package assembly (e.g., IC package assembly 100, 200, 300 of FIGS. 1-3 or the IC package assembly of FIGS. 4A-K) as described herein, in accordance with some embodiments. The computing device 900 may house a board such as motherboard 902 (e.g., in housing 908). The housing 908 may be any of a wide variety of suitable articles including, for example, a protective material of a wearable device or small form-factor device. The motherboard 902 may include a number of components, including but not limited to a processor 904 and at least one communication chip 906. The processor 904 may be physically and electrically coupled to the motherboard 902. In some implementations, the at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, EV-DO, and others.

The processor 904 of the computing device 900 may be packaged in an IC package assembly (e.g., IC package assembly 100, 200, 300 of FIGS. 1-3 or the IC package assembly of FIGS. 4A-K) as described herein. For example, the encapsulant (e.g., encapsulant 108 of the IC package assembly 100, 200, 300 of FIGS. 1-3 or the IC package assembly of FIGS. 4A-K) may serve as a motherboard 902 and the processor 904 may be a die of the dies (e.g., dies 110 of the IC package assembly 100, 200, 300 of FIGS. 1-3 or the IC package assembly of FIGS. 4A-K) as described herein. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 906 may also include a die that may be packaged in an IC package assembly (e.g., IC package assembly 100, 200, 300 of FIGS. 1-3 or the IC package assembly of FIGS. 4A-K) as described herein. In further implementations, another component (e.g., memory device or other integrated circuit device) housed within the computing device 900 may include a die that may be packaged in an IC package assembly (e.g., IC package assembly 100, 200, 300 of FIGS. 1-3 or the IC package assembly of FIGS. 4A-K) as described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 900 may be a mobile computing device in some embodiments. In further implementations, the computing device 900 may be any other electronic device that processes data.

EXAMPLES

According to various embodiments, the present disclosure describes an apparatus. Example 1 of an apparatus may include a substrate having a first side and a second side disposed opposite to the first side and a sidewall disposed between the first side and the second side, the sidewall defining a perimeter of the substrate, a plurality of through-substrate vias (TSVs) disposed between the first side and the second side of the substrate, a first dielectric layer disposed on the first side and including electrical routing features to route electrical signals of one or more dies in a plane of the first dielectric layer, and a second dielectric layer disposed on the second side and including electrical routing features to route electrical signals of the one or more dies in a plane of the second dielectric layer, wherein the sidewall is configured to receive attachment of the one or more dies on respective surfaces of the sidewall. Example 2 may include the apparatus of Example 1, wherein one or more TSVs of the plurality of TSVs are configured to route electrical signals between a first die and a second die of the one or more dies. Example 3 may include the apparatus of Example 1, wherein one or more TSVs of the plurality of TSVs are thermal TSVs configured to route heat away from the substrate. Example 4 may include the apparatus of Example 1, further comprising electrical routing features disposed on the sidewall and configured to route electrical signals between a first die and a second die of the one or more dies. Example 5 may include the apparatus of any of Examples 1-4, further comprising a first die of the one or more dies attached to the sidewall and a second die of the one or more dies attached to the sidewall, wherein the first die and the second die are electrically coupled together. Example 6 may include the apparatus of Example 5, wherein the sidewall has three or more sides and the first die is coupled with a first side of the three or more sides and the second die is coupled with a second side of the three or more sides. Example 7 may include the apparatus of Example 5, wherein the first die is electrically coupled with the second die by electrical routing features of the first dielectric layer and/or the second dielectric layer. Example 8 may include the apparatus of Example 5, wherein the first die is electrically coupled with the second die by electrical routing features disposed on the sidewall. Example 9 may include the apparatus of Example 5, further comprising an encapsulant at least partially encapsulating the first die and the second die. Example 10 may include the apparatus of Example 9, further comprising a heat spreader film disposed on the first die, the second die, and the encapsulant. Example 11 may include the apparatus of any of Examples 1-4, further comprising a power or ground plane coupled with the second dielectric layer. Example 12 may include the apparatus of any of Examples 1-4, further comprising a device layer disposed on the first side of the substrate between the substrate and the first dielectric layer, the device layer including one or more active devices. Example 13 may include the apparatus of any of Examples 1-4, wherein the substrate comprises a semiconductor material or glass.

According to various embodiments, the present disclosure describes an assembly. Example 14 of an assembly may include a wearable article, smart-pen or wallet, wherein the wearable article or the smart-pen or the wallet includes the apparatus of any of Examples 1-13. Example 15 may include the assembly of Example 14, wherein the wearable article includes a button or spectacle frame.

According to various embodiments, the present disclosure describes a method. Example 16 of a method may include providing a substrate having a first side and a second side disposed opposite to the first side and a sidewall disposed between the first side and the second side, the sidewall defining a perimeter of the substrate, forming a plurality of through-substrate vias (TSVs) between the first side and the second side of the substrate, forming a first dielectric layer on the first side and including electrical routing features to route electrical signals of one or more dies in a plane of the first dielectric layer, and forming a second dielectric layer disposed on the second side and including electrical routing features to route electrical signals of the one or more dies in a plane of the second dielectric layer, wherein the sidewall is configured to receive attachment of the one or more dies on respective surfaces of the sidewall. Example 17 may include the method of Example 16, further comprising attaching a first die of the one or more dies to the sidewall and attaching a second die of the one or more dies to the sidewall, wherein the first die and the second die are electrically coupled with the electrical routing features of the first dielectric layer and/or the second dielectric layer.

According to various embodiments, the present disclosure describes another method. Example 18 of a method may include encapsulating a plurality of dies in a flexible encapsulant, forming electrical routing features on the plurality of dies, and coupling the plurality of dies to respective surfaces of a sidewall of a substrate, the substrate having a first side and a second side disposed opposite to the first side, the sidewall being disposed between the first side and the second side and defining a perimeter of the substrate, wherein a plurality of through-substrate vias (TSVs) are disposed between the first side and the second side of the substrate. Example 19 may include the method of Example 18, wherein encapsulating the plurality of dies in the flexible encapsulant comprises coupling an active side of the plurality of dies to a carrier, depositing the flexible encapsulate on the plurality of dies, and decoupling the plurality of dies from the carrier. Example 20 may include the method of Example 18, wherein forming the electrical routing features comprises depositing a metal foil on an active side of the plurality of dies, patterning the metal foil to form pads or traces, and depositing a solder mask layer on the pads or traces. Example 21 may include the method of any of Examples 18-20, wherein coupling the plurality of dies to respective surfaces of the sidewall of the substrate comprises wrapping the flexible encapsulant with the plurality of dies around the sidewall of the substrate and applying a thermal process to cure the flexible encapsulant. Example 22 may include the method of any of Examples 18-20, further comprising coupling a heat spreader film with an inactive side of the plurality of dies prior to coupling the plurality of dies to respective surfaces of the sidewall. Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. The apparatus comprising:
    a substrate having a first side and a second side disposed opposite to the first side and a sidewall disposed between the first side and the second side, the sidewall defining a perimeter of the substrate;
    a plurality of through-substrate vias (TSVs) disposed between the first side and the second side of the substrate;
    a first dielectric layer disposed on the first side and including electrical routing features to route electrical signals of one or more dies in a plane of the first dielectric layer; and
    a second dielectric layer disposed on the second side and including electrical routing features to route electrical signals of the one or more dies in a plane of the second dielectric layer, wherein the sidewall is configured to receive attachment of the one or more dies on respective surfaces of the sidewall.

2. The apparatus of claim 1, wherein one or more TSVs of the plurality of TSVs are configured to route electrical signals between a first die and a second die of the one or more dies.

3. The apparatus of claim 1, wherein one or more TSVs of the plurality of TSVs are thermal TSVs configured to route heat away from the substrate.

4. The apparatus of claim 1, further comprising:
electrical routing features disposed on the sidewall and configured to route electrical signals between a first die and a second die of the one or more dies.

5. The apparatus of claim 1, further comprising:
a first die of the one or more dies attached to the sidewall; and
a second die of the one or more dies attached to the sidewall, wherein the first die and the second die are electrically coupled together.

6. The apparatus of claim 5, wherein:
the sidewall has three or more sides;
the first die is coupled with a first side of the three or more sides; and
the second die is coupled with a second side of the three or more sides.

7. The apparatus of claim 5, wherein:
the first die is electrically coupled with the second die by electrical routing features of the first dielectric layer and/or the second dielectric layer.

8. The apparatus of claim 5, wherein:
the first die is electrically coupled with the second die by electrical routing features disposed on the sidewall.

9. The apparatus of claim 5, further comprising:
an encapsulant at least partially encapsulating the first die and the second die.

10. The apparatus of claim 9, further comprising:
a heat spreader film disposed on the first die, the second die, and the encapsulant.

11. The apparatus of claim 1, further comprising
a power or ground plane coupled with the second dielectric layer.

12. The apparatus of claim 1, further comprising:
a device layer disposed on the first side of the substrate between the substrate and the first dielectric layer, the device layer including one or more active devices.

13. The apparatus of a claim 1, wherein the substrate comprises a semiconductor material or glass.

14. An assembly comprising:
a wearable article, smart-pen or wallet, wherein the wearable article or the smart-pen or the wallet includes the apparatus of any of claims 1-13.

15. The assembly of claim 14, wherein the wearable article includes a button or spectacle frame.

16. A method comprising:
providing a substrate having a first side and a second side disposed opposite to the first side and a sidewall disposed between the first side and the second side, the sidewall defining a perimeter of the substrate;
forming a plurality of through-substrate vias (TSVs) between the first side and the second side of the substrate;
forming a first dielectric layer on the first side and including electrical routing features to route electrical signals of one or more dies in a plane of the first dielectric layer; and
forming a second dielectric layer disposed on the second side and including electrical routing features to route electrical signals of the one or more dies in a plane of the second dielectric layer, wherein the sidewall is configured to receive attachment of the one or more dies on respective surfaces of the sidewall.

17. The method of claim 16, further comprising:
attaching a first die of the one or more dies to the sidewall; and
attaching a second die of the one or more dies to the sidewall, wherein the first die and the second die are electrically coupled with the electrical routing features of the first dielectric layer and/or the second dielectric layer.

18. A method comprising:
encapsulating a plurality of dies in a flexible encapsulant;
forming electrical routing features on the plurality of dies; and
coupling the plurality of dies to respective surfaces of a sidewall of a substrate, the substrate having a first side and a second side disposed opposite to the first side, the sidewall being disposed between the first side and the second side and defining a perimeter of the substrate, wherein a plurality of through-substrate vias (TSVs) are disposed between the first side and the second side of the substrate.

19. The method of claim 18, wherein encapsulating the plurality of dies in the flexible encapsulant comprises:
coupling an active side of the plurality of dies to a carrier;
depositing the flexible encapsulate on the plurality of dies; and
decoupling the plurality of dies from the carrier.

20. The method of claim 18, wherein forming the electrical routing features comprises:
depositing a metal foil on an active side of the plurality of dies;
patterning the metal foil to form pads or traces; and
depositing a solder mask layer on the pads or traces.

21. The method of claim 18, wherein coupling the plurality of dies to respective surfaces of the sidewall of the substrate comprises:
wrapping the flexible encapsulant with the plurality of dies around the sidewall of the substrate; and
applying a thermal process to cure the flexible encapsulant.

22. The method of claim 18, further comprising:
coupling a heat spreader film with an inactive side of the plurality of dies prior to coupling the plurality of dies to respective surfaces of the sidewall.

* * * * *